United States Patent
Kuenemund et al.

(10) Patent No.: US 11,171,647 B2
(45) Date of Patent: Nov. 9, 2021

(54) INTEGRATED ELECTRONIC CIRCUIT

(71) Applicant: Infineon Technologies AG, Neubiberg (DE)

(72) Inventors: Thomas Kuenemund, Munich (DE); Berndt Gammel, Markt-Schwaben (DE); Franz Klug, Aying (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 15/931,966

(22) Filed: May 14, 2020

(65) Prior Publication Data

US 2020/0366291 A1 Nov. 19, 2020

(30) Foreign Application Priority Data

May 14, 2019 (DE) .......................... 102019112583.9

(51) Int. Cl.
*H03K 19/003* (2006.01)
*H03K 19/094* (2006.01)

(52) U.S. Cl.
CPC ......... *H03K 19/003* (2013.01); *H03K 19/094* (2013.01)

(58) Field of Classification Search
CPC ........................... H03K 19/003; H03K 19/094
See application file for complete search history.

(56) References Cited

U.S. PATENT DOCUMENTS

| | | | |
|---|---|---|---|
| 2011/0255694 A1* | 10/2011 | Miyauchi | H04L 9/0894 380/277 |
| 2012/0328106 A1* | 12/2012 | Dellow | G06F 21/73 380/285 |
| 2015/0294944 A1* | 10/2015 | Kuenemund | H03K 3/356104 326/8 |
| 2017/0019104 A1 | 1/2017 | Kuenemund | |
| 2017/0317677 A1* | 11/2017 | Muchsel | H03K 19/00315 |
| 2018/0091155 A1 | 3/2018 | Kuenemund | |

FOREIGN PATENT DOCUMENTS

WO 94/11950 A1 5/1994

* cited by examiner

*Primary Examiner* — Kurtis R Bahr
(74) *Attorney, Agent, or Firm* — Cooper Legal Group LLC

(57) ABSTRACT

According to one embodiment, an integrated electronic circuit has a switching network configured to receive binary control states, one or more secret-carrying gates, wherein each secret-carrying gate represents Boolean secrets and is configured to receive binary input states and to output one or more Boolean secrets according to a state sequence of the binary input states, and one or more flip-flops configured to store binary output states output by the switching network and to supply binary input states to the one or more secret-carrying gates based on the stored binary output states. The switching network generates the binary output states by combining the binary control states and Boolean secrets output by the one or more secret-carrying gates. The integrated electronic circuit outputs Boolean secrets from the one or more secret-carrying gates and/or the binary output states from the switching network to another integrated electronic circuit.

20 Claims, 12 Drawing Sheets

INTEGRATED ELECTRONIC CIRCUIT

RELATED APPLICATION

This application claims priority to German Patent Application No. 102019112583.9, filed on May 14, 2019, entitled "INTEGRIERTE ELEKTRONISCHE SCHALTUNG", which is incorporated by reference herein in its entirety.

SUMMARY

Exemplary embodiments relate in general to integrated electronic circuits.

The reverse engineering (RE) of integrated circuits (IC) can be considered one of the greatest threats to the semiconductor industry, because it can be misused by an attacker to steal and/or acquire a circuit design. An attacker who successfully reverse engineers an integrated circuit can create and sell a similar, i.e. cloned circuit, and illegally sell and make the design public and, for example, divulge the trade secrets of a competitor.

Designs and techniques that prevent the reverse engineering of integrated circuits, or at least make it more difficult, are therefore desirable.

According to one embodiment, an integrated electronic circuit is provided. The integrated electronic circuit may comprise a switching network configured to receive binary control states. The integrated electronic circuit may comprise one or more secret-carrying gates, wherein each secret-carrying gate of the one or more secret-carrying gates represents Boolean secrets and is configured to receive binary input states and to output one or more Boolean secrets of the Boolean secrets according to a state sequence (e.g., a chronological state sequence) of the binary input states. The integrated electronic circuit may comprise one or more flip-flops configured to store binary output states output by the switching network and to supply binary input states to the one or more secret-carrying gates based on the stored binary output states, wherein the switching network is configured to generate the binary output states by combining the binary control states and Boolean secrets output by the one or more secret-carrying gates. The integrated electronic circuit may comprise an output configured to output Boolean secrets output by the one or more secret-carrying gates and/or binary output states output by the switching network to another integrated electronic circuit.

DESCRIPTION OF THE DRAWINGS

The figures do not reflect the actual proportions, but are intended to illustrate the principles of the various exemplary embodiments. In the following text various exemplary embodiments are described with reference to the following figures.

DETAILED DESCRIPTION

The following detailed description refers to the enclosed figures, which show details and exemplary embodiments. These exemplary embodiments are described in sufficient detail to enable the person skilled in the art to embody the present disclosure. Other embodiments are also possible, and the exemplary embodiments can be modified in terms of their structural, logical and electrical aspects without deviating from the subject matter of the present disclosure. The different exemplary embodiments are not necessarily mutually exclusive, but different embodiments can be combined to create new embodiments. For the purposes of this description, the terms "connected" and "coupled" are used to describe both a direct and indirect connection, and a direct or indirect coupling.

Figure 1:
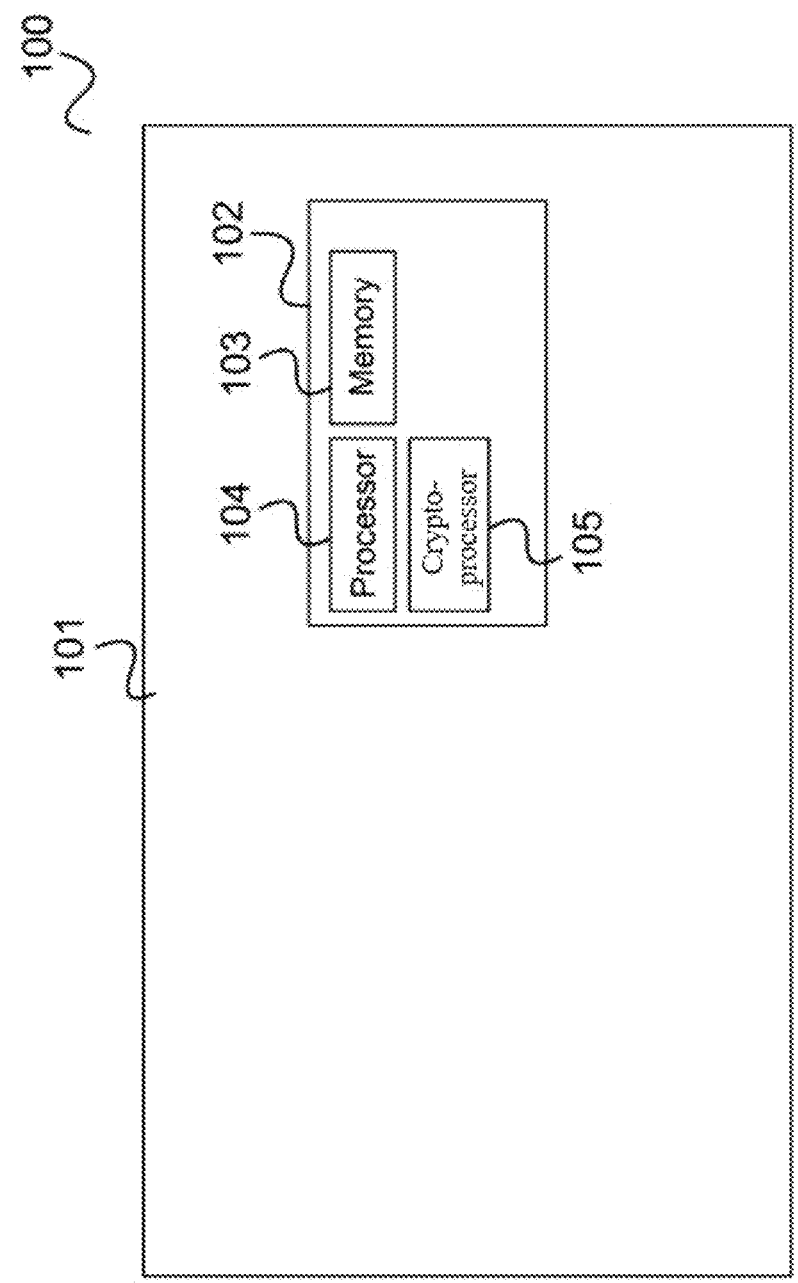
FIG. 1 shows a communication system according to an exemplary embodiment.

It is desirable to protect a large number of chips from reverse engineering, such as for chips used in security-related contexts such as on a chip card, as shown in FIG. 1.

FIG. 1 shows a chip card 100 according to one embodiment.

The chip card 100 comprises a carrier 101 on which a chip card module 102 is arranged. The chip card module 102 comprises different data processing components, such as a memory 103, a processor 104, and/or a cryptoprocessor 105 (e.g., a dedicated cryptographic processor), for example.

For example, the chip card module 102 is designed to be protected against reverse engineering. However, this should be considered only as an example and chips in many different application areas can be protected against reverse engineering in accordance with exemplary embodiments, e.g., microcontroller chips, e.g., in control devices such as found in a vehicle, e.g., in an ECU (electronic control unit), for chip cards with an arbitrary form factor, communication chips, control chips of different devices, such as printers, etc.

Typically, in an integrated circuit that is to be protected against reverse engineering, a logic function $y_j=f(x_i)$ will calculate a result $y_j$ secretly from inputs $x_i$. Circuits for protecting against reverse engineering are often referred to as camouflage circuits. In some implementation techniques, if such a circuit is based on reverse engineering it implements a different logic function than it does in the original circuit this explains the designation "camouflage".

Different exemplary embodiments are based on a subset of camouflage mechanisms, namely cells (such as gates), which provide one or more Boolean secrets and are referred to in the following as MH cells (for "Magic Hood"). Strictly speaking, these cells are not necessarily camouflage circuits in the above sense (but are nevertheless understood as such in the following), since the cells can typically be identified by reverse engineering. However, the output value of an MH cell cannot be obtained in classical static reverse engineering process (slice-by-slice analysis, combination and reconstruction of the circuit) based on conventional reverse engineering techniques. In some examples, only if the output of the active circuit is measured at the correct time can its secret output be determined.

MH cells have some non-trivial properties that can be used to build circuits that protect secrecy in the event of reverse engineering while providing integrity protection in the event of an active attack (by needling and/or laser fault injection (LFI)).

According to various exemplary embodiments, finite automata are implemented based on secret-carrying gates (which carry Boolean secrets), such as MU cells.

An MH cell (or MH gate) has a secret state in a given clock cycle. Depending on its state, one or more specific input states transfer the MH cell into a new secret state (corresponding to a Boolean secret that it stores). In some examples, the MH cell therefore demonstrably comprises a memory and depending on its current state (which depends on the past), certain input state transitions (e.g., only the certain input state transitions) are permitted, i.e there are prohibited disallowed) input state transitions.

Figure 2:
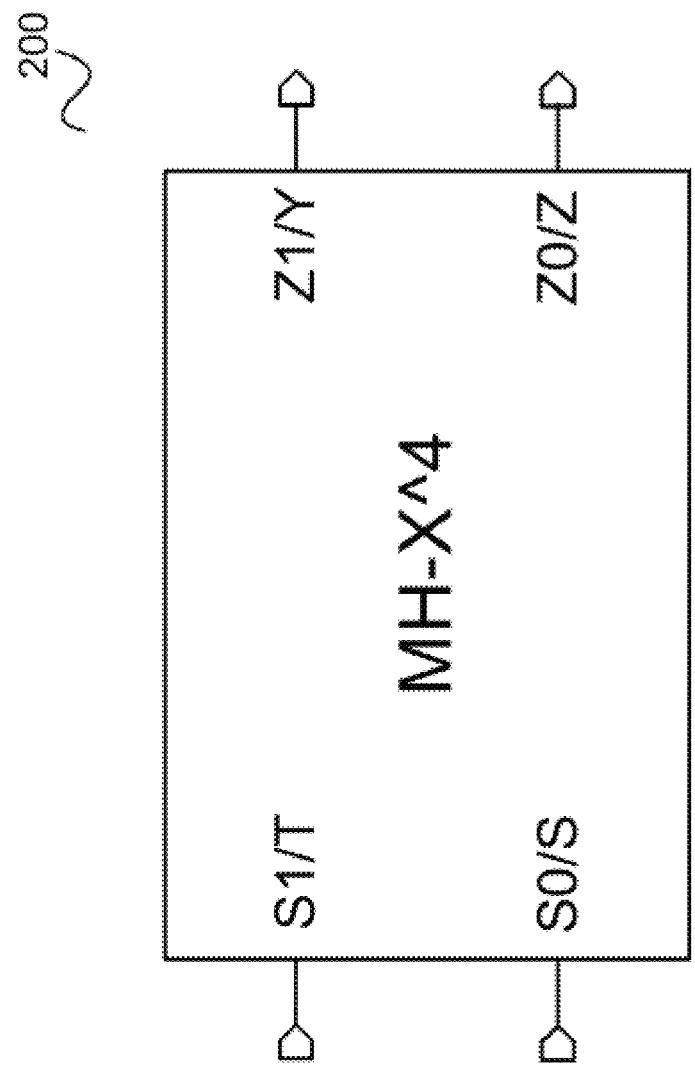
FIG. 2 shows the gate symbol of an MH gate.

FIG. 2 shows the gate symbol of an MH gate 200.

As can be seen from the gate symbol, the MH gate 200, which is referred to as MH-X^4 because it represents four Boolean secrets, has the two input states S1 (or T) and S0 (or S) as well as the two output states Z1 (or Y) and Z0 (or Z).

The following assignments initially apply between the two pre-charge states <S1,S0> of the input signals and those of the output signals <Z1,Z0>:

Pre-charge state 0: <S1,S0>=<0,0> implies <Z1,Z0>=<0,0>, and

Pre-charge state 1: <S1,S0>=<1,1> implies <Z1,Z0>=<1,1>.

The following rules also apply to state transitions based on one of the two pre-charge states:

The state transition (symbolized by an arrow "→")
<S1,S0>=<0,0>→<0,1> implies <Z1,Z0>=<0,0>→<X0,\X0>, the state transition
<S1,S0>=<1,1>→<0,1> implies <Z1,Z0>=<1,1>→<X2,\X2>, the state transition
<S1,S0>=<0,0>→<1,0> implies <Z1,Z0>=<0,0>→<X1,\X1> and the state transition
<S1,S0>=<1,1>→<1,0> implies <Z1,Z0>=<1,1>→<X3,\X3>.

The four Boolean secrets independent of each other hidden in MH-X^4 are designated here as Xn for n=0,1,2,3 and each Xn can be 0 or 1. The Boolean secrets in the state transitions specified above appear at the outputs Z1 and Z0 of MH-X^4, where the Boolean inversion NOT(X) of X is designated \X:\X=NOT(X).

Alternatively and/or additionally, the operations J+K and J*K refer to the Boolean OR logic operation and the AND logic operation of J and K, respectively.

The two state transitions of the input signals
<S1,S0>=<0,1>→<1,0> and
<S1,S0>=<1,0>→<0,1> may not be permitted because they would result in undefined (meta-stable) behavior of MH-X^4 and/or of <Z1,Z0>.

Since the MH gate MH-X^4 can represent four independent Boolean secrets, there are 16 permutations of the MH gate MH-X^4, depending on which combination of the four secrets it represents.

Figure 3:
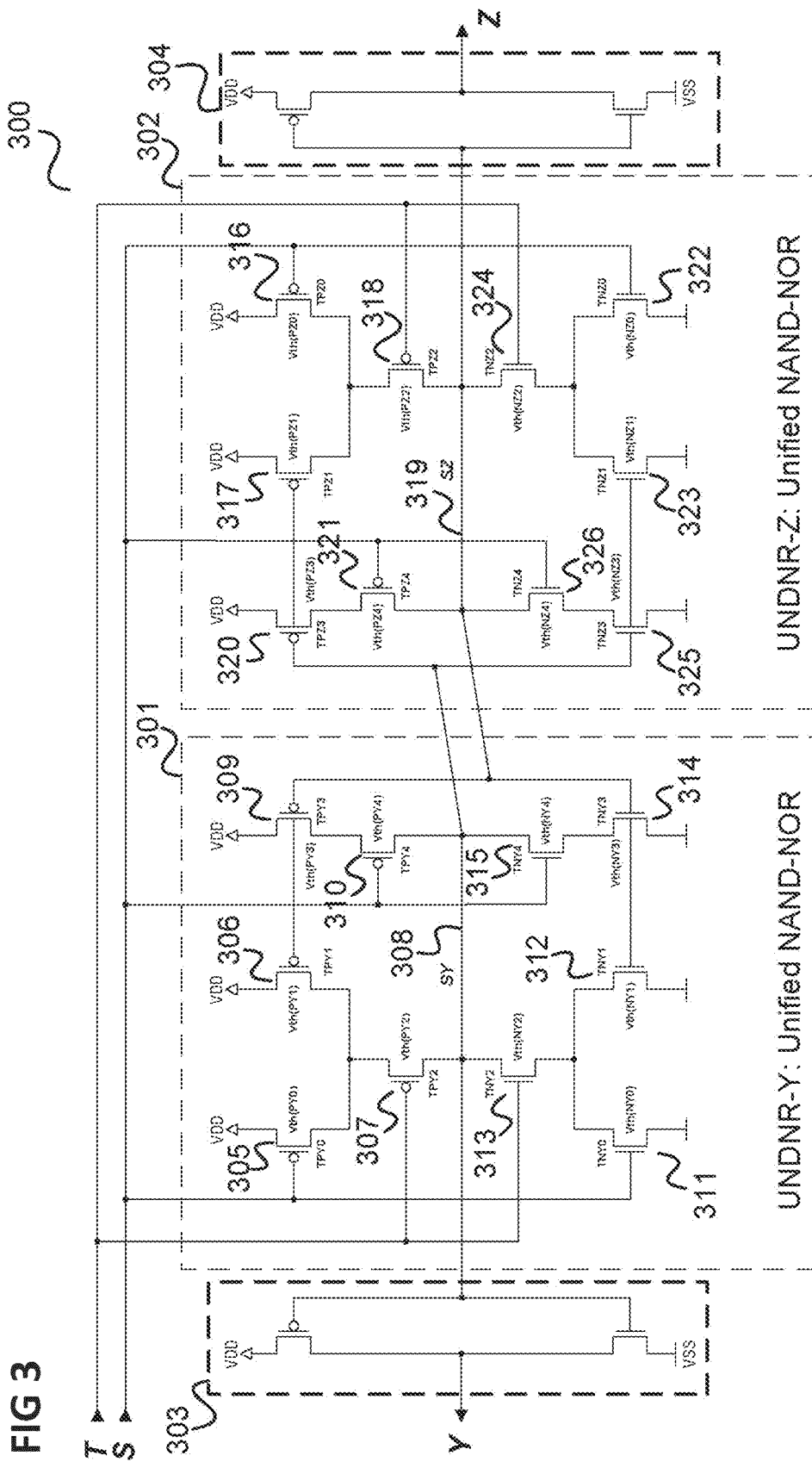
FIG. 3 shows a circuit which implements an MH cell based on self-dual NAND-NOR gates.

An example of an implementation of the MH gate MH-X^4 is shown in FIG. 3.

FIG. 3 shows a circuit 300 that implements an MH cell based on self-dual NAND-NOR gates.

The circuit 300 has two inputs T and S and two outputs Z and Y. For example, inputs T and S correspond to S1 and S0 from FIG. 2 and outputs Z and Y correspond to Z1 and Z0 from FIG. 2.

As in the example of FIG. 2, the MH cell 300 represents four Boolean secrets X0, X1, X2, X3. The secrets stored by the MH cell 300 are determined from the configuration of various field-effect transistors (FETs) of the MH cell 300, as will be explained below. Here, Vth(FET name) denotes the threshold voltage of an FET designated by FET-name.

The circuit 300 comprises a first unified NAND-NOR gate 301, a second unified NAND-NOR gate 302, a first inverter 303 and a second inverter 304.

The first unified NAND-NOR gate 301 comprises a first p-channel FET 305, the source of which is connected to the high supply potential (VDD) and the gate of which is supplied with the signal S. The first unified NAND-NOR gate 301 also comprises a second p-channel FET 306, the source of which is connected to the high supply potential (VDD). The drains of the first p-channel FET 305 and the second p-channel FET 306 are connected to the source of a third p-channel FET 307, the gate of which is supplied with the signal T and the drain of which is connected to a first output node (or feedback node) 308, the state of which is designated SY.

The first unified NAND-NOR gate 301 also comprises a fourth p-channel FET 309, the source of which is connected to the high supply potential, the gate of which is connected to the gate of the second p-channel FET 306 and the drain of which is connected to the source of a fifth p-channel FET 310, the gate of which is supplied with the signal S and the drain of which is connected to the first output node 308.

Alternatively and/or additionally, the first unified NAND-NOR gate 301 comprises a first n-channel FET 311, the source of which is connected to the low supply potential (VSS) and the gate of which is supplied with the signal S. The first unified NAND-NOR gate 301 also comprises a second n-channel FET 312, the source of which is connected to the low supply potential (VSS). The drains of the first n-channel FET 311 and the second n-channel FET 312 are connected to the source of a third n-channel FET 313, the gate of which is supplied with the signal T and the drain of which is connected to the first output node 308.

The first unified NAND-NOR gate 301 also comprises a fourth n-channel FET 314, the source of which is connected to the low supply potential, the gate of which is connected to the gate of the second n-channel FET 312 and the drain of which is connected to the source of a fifth n-channel FET 315, the gate of which is supplied with the signal S and the drain of which is connected to the first output node 308.

The first unified NAND-NOR gate 302 comprises a sixth p-channel FET 316, the source of which is connected to the high supply potential (VDD) and the gate of which is supplied with the signal S. The second unified NAND-NOR gate 302 also comprises a seventh p-channel FET 317, the source of which is connected to the high supply potential (VDD). The drains of the sixth p-channel FET 316 and the seventh p-channel FET 317 are connected to the source of an eighth p-channel FET 318, the gate of which is supplied with the signal T and the drain of which is connected to a second output node (or feedback node) 319, the state of which is designated SZ.

The second unified NAND-NOR gate 302 also comprises a ninth p-channel FET 320, the source of which is connected to the high supply potential, the gate of which is connected to the gate of the seventh p-channel FET 317 and the drain of which is connected to the source of a tenth p-channel FET 321, the gate of which is supplied with the signal S and the drain of which is connected to the second output node 319. Alternatively and/or additionally, the second unified NAND-NOR gate 302 comprises a sixth n-channel FET 322, the source of which is connected to the low supply potential (VSS) and the gate of which is supplied with the signal S. The second unified NAND-NOR gate 302 also comprises a seventh n-channel FET 323, the source of which is connected to the low supply potential (VSS). The drains of the sixth n-channel FET 322 and the seventh n-channel FET 323 are connected to the source of an eighth n-channel FET 324, the gate of which is supplied with the signal T and the drain of which is connected to the second output node 319.

The second unified NAND-NOR gate 302 also comprises a ninth n-channel FET 325, the source of which is connected to the low supply potential, the gate of which is connected to the gate of the seventh n-channel FET 323 and the drain of which is connected to the source of a tenth n-channel FET 326, the gate of which is supplied with the signal S and the drain of which is connected to the second output node 319.

The first output node 308 is also connected to the input of the first inverter 303, the output of which is the output Y. Alternatively and/or additionally, the first output node 308 is connected to the gates of the ninth p-channel FET 320 and the ninth n-channel FET 325.

The second output node 319 is also connected to the input of the second inverter 304, the output of which is the output Z. Alternatively and/or additionally, the second output node 319 is connected to the gates of the fourth p-channel FET 309 and the fourth n-channel FET 314.

The inverters 303, 304 are implemented, for example, by a p-channel FET and an n-channel FET, which are connected in series between the high supply potential and the low potential, which the input of the inverters 303, 304 receive at their gates and wherein the node between them is the output node of the respective inverters 303, 304.

For (T, S)=(0, 0) the circuit 300 is located in a first pre-charge state:

$$(T,S)=(0,0) \Rightarrow (SZ,SY)=(1,1) \Rightarrow (Z,Y)=(0,0),$$

and for (T, S)=(1, 1), the circuit is in a second pre-charge state:

$$(T,S)=(1,1) \Rightarrow (SZ,SY)=(0,0) \Rightarrow (Z,Y)=(1,1).$$

The first state transition that results in the output of a Boolean secret represented by the MH cell 300 is given by (T, S)=(0, 0)→(0, 1), wherein the two competing pull-down paths, including the serial connections of the tenth n-channel FET 326, labeled TNZ4, and the ninth n-channel FET 325, labeled TNZ3, for SZ, and the fifth n-channel FET 315, labeled TNY4, and the fourth n-channel FET 314, labeled TNY3, for SY, are activated.

As a result, the two different threshold voltage configurations

Vth(NZ4)<Vth(NY4); Vth(NZ3)<Vth(NY3) and
Vth(NZ4)>Vth(NY4); Vth(NZ3)>Vth(NY3)

correspond to the two different values X0=1 and X0=0 for the first state transition:

$$(T,S)=(0,0) \rightarrow (0,1) \Rightarrow (Z,Y)=(0,0) \rightarrow (X0, NOT(X0)).$$

The second state transition, which results in the output of a Boolean secret represented by the MH cell 300, is given by (T, S)=(0, 0)→(1, 0), wherein the two competing pull-down paths, including the serial connections of the eighth n-channel FET 324, labeled TNZ2, and the seventh n-channel FET 323, labeled TNZ1, for SZ, and the third n-channel FET 313, labeled TNY2, and the second n-channel FET 312, labeled TNY1, for SY, are activated.

As a result, the two different threshold voltage configurations

Vth(NZ2)<Vth(NY2); Vth(NZ1)<Vth(NY1) and
Vth(NZ2)>Vth(NY2); Vth(NZ1)>Vth(NY1)

correspond to the two different values X1=1 and X1=0 for the second state transition $$(T,S)=(0,0) \rightarrow (1,0) \Rightarrow (Z,Y)=(0,0) \rightarrow (X1, NOT(X1)).$$

The third state transition, which results in the output of a Boolean secret represented by the MH cell 300, is given by (T, S)=(1, 1)→(1, 0), wherein the two competing pull-up paths, including the serial connections of the tenth p-channel FET 321, labeled TPZ4, and the ninth p-channel FET 320, labeled TPZ3, for SZ, and the fifth p-channel FET 310, labeled TPY4, and the fourth p-channel FET 309, labeled TPY3, for SY, are activated.

As a result, the two different threshold voltage configurations

Vth(PZ4)<Vth(PY4); Vth(PZ3)<Vth(PY3) and
Vth(PZ4)>Vth(PY4); Vth(PZ3)>Vth(PY3)

correspond to the two different values X3=0 and X3=1 for the third transition:

$$(T,S)=(1,1) \rightarrow (1,0) \Rightarrow (Z,Y)=(1,1) \rightarrow (X3, NOT(X3)).$$

The fourth state transition, which results in the output of a Boolean secret represented by the MH cell 300, is given by (T, S)=(1, 1)→(0, 1), wherein the two competing pull-up paths, including the serial connections of the eighth p-channel FET 318, labeled TPZ2, and the seventh p-channel FET 317, labeled TPZ1, for SZ, and the third p-channel FET 307, labeled TPY2, and the second p-channel FET 306, labeled TPY1, for SY, are activated.

As a result, the two different threshold voltage configurations

Vth(PZ2)<Vth(PY2); Vth(PZ1)<Vth(PY1) and
Vth(PZ2)>Vth(PY2); Vth(PZ1)>Vth(PY1)

correspond to the two different values X2=0 and X2=1 for the fourth transition:

$$(T,S)=(1,1) \rightarrow (0,1) \Rightarrow (Z,Y)=(1,1) \rightarrow (X2, NOT(X2)).$$

Because all four relevant pull-up and pull-down paths (and/or some of the four relevant pull-up and pull-down paths) differ from each other and can therefore be selected independently of each other, the four MH secrets, i.e. the values X0, X1, X3 and X2, can also be selected independently. Accordingly, for the MH which is based on the self-dual gates of FIG. 3, $2^4$=16 different MH incarnations can be realized, i.e. 16 different MH permutations, which have the same physical layout (i.e. are indistinguishable in terms of their physical design). However, due to their different CMOS (Complementary Metal Oxide Semiconductor) threshold voltage configurations, they exhibit different electronic behaviors. Alternatively and/or additionally, the independence of X0, X1, X3 and X2 corresponds to a path-dependency of the Boolean secrets, i.e. each secret (X0, X1, X3 and X2) depends not only on the input control signal state, but also on the manner in which this state was reached.

The various threshold voltage configurations can be set using suitable types of doping.

According to different embodiments, the MH-X^4 gate of FIG. 2 is used as an element of a switching logic, as described below.

Figure 4:
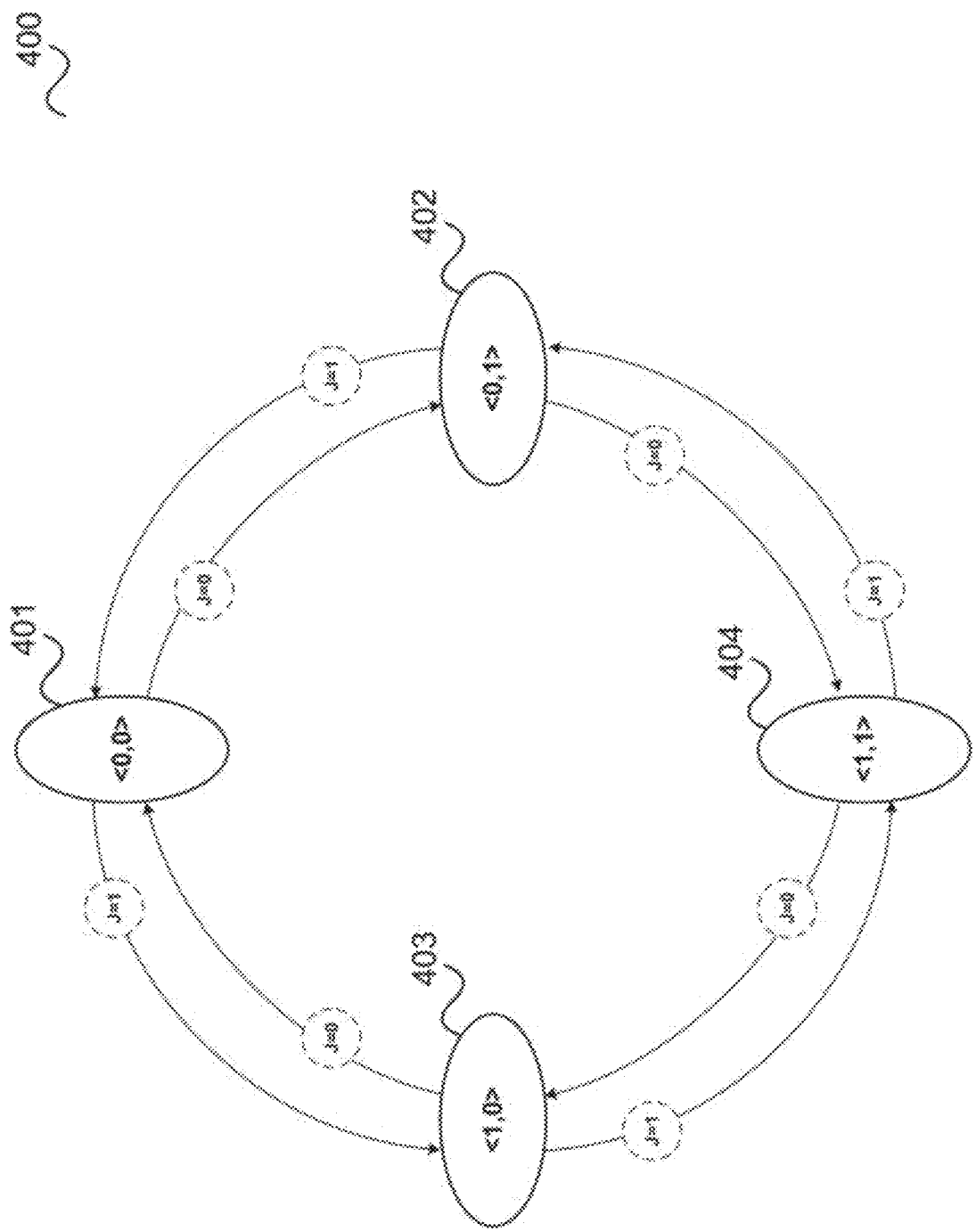
FIG. 4 shows a state diagram for a switching logic according to one embodiment.

FIG. 4 shows a state diagram 400 for a switching logic according to one embodiment.

The states <S1,S0>=<0,0>, <0,1>, <1,0>, <1,1> of the input states of MH-X^4 are interpreted as states 401, 402, 403, 404 of the corresponding switching logic with input state J.

The four possible states of <S1,S0> are represented by oval symbols, each containing one of the four possible values of <S1,S0>, while the conditions necessary on the input state J of the switching logic for the possible state transitions between states 401 to 404 are indicated within the dashed circles.

The state diagram also shows that the two disallowed input state transitions
<S1,S0>=<0,1>→<1,0> and <S1,S0>=<1,0>→<0,1>
are not realized by the corresponding switching logic.

Impermissible input state transitions can be used to secure state transitions of the MH cell, i.e. to prevent an attacker from reaching an arbitrary state by manipulating input states of an MH cell. For example, impermissible input state transitions can be mapped to a safe state of the MH cell, starting from which the secrets represented by the MH cell can no longer be reached (and the MH cell, for example, constantly outputs only 00 or 11).

Figure 5:
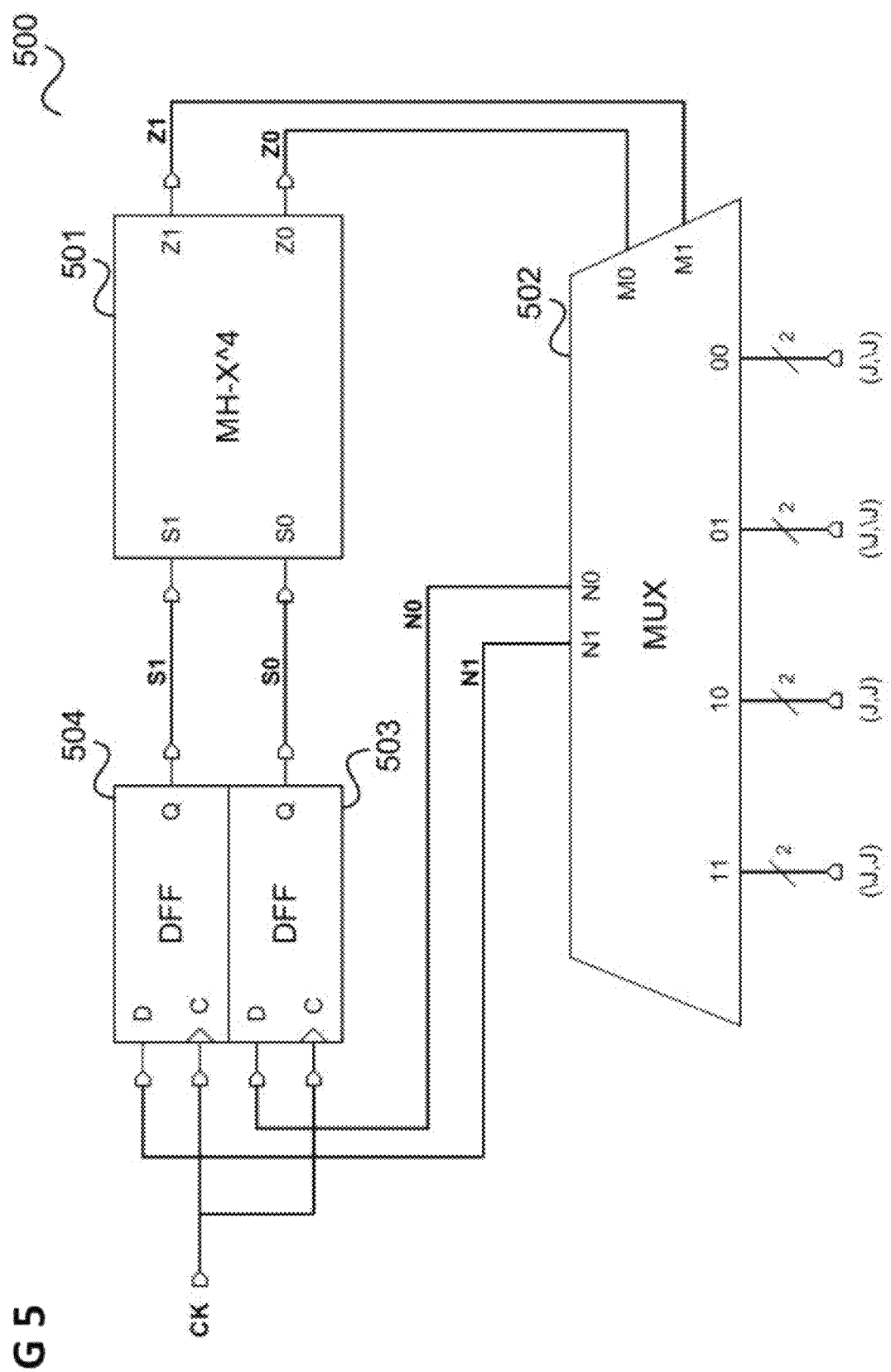
FIG. 5 shows a circuit for implementing a switching logic corresponding to the state diagram.

FIG. 5 shows a circuit (such as a switching logic) 500 for implementing a switching logic corresponding to the state diagram 400.

The circuit comprises an MH gate 501 (e.g., an MH gate MH-X^4), as shown in FIG. 2. The two outputs of the MH gate 501 are connected to control inputs M0 and M1 of a switching network 502, in this example a multiplexer MUX. The multiplexer has four data inputs that are assigned to the four possible bit combinations at the control inputs M0 and M1.

The circuit receives a control state J. The combinations <\J,J>, <J,J>, <J,\J> and <\J,\J> are fed to the data inputs of the multiplexer 502 in such a way that:
<Z1,Z0>=<1,1> implies <N1,N0>=<\J,J>,
<Z1,Z0>=<1,0> implies <N1,N0>=<J,J>,
<Z1,Z0>=<0,1> implies <N1,N0>=<\J,\J>,
<Z1,Z0>=<0,0> implies <N1,N0>=<J,\J>,
where N0 and N1 indicate the output states of the multiplexer 502.

The circuit 502 also comprises two flip-flops 503 and 504. The flip-flops 503 and 504 may be clock-edge-controlled data flip-flops. Both flip-flops 503 and 504 receive a clock signal CK at their respective clock input. The first flip-flop 503 receives the output state N0 of the multiplexer 502 and the second flip-flop 504 receives the output state N1 of the multiplexer 502. The value stored by the first flip-flop 503 is the input state S0 of the MH gate 501 and the value stored by the second flip-flop 504 is the input state S1 of the MH gate 501.

The input control state J of the switching logic concerned can change within each period of the system clock CK. For example, J can be derived from outputs Z1 and Z0 of other MH-X^4 gates from another switching logic which is similar or identical in design.

In this way, any complex arrangements of switching logics of the type under consideration can be set up, wherein one, some and/or all state transitions in one, some and/or all switching logics depend on one, some and/or all Boolean secrets hidden in the MH-X^4.

Figure 6:
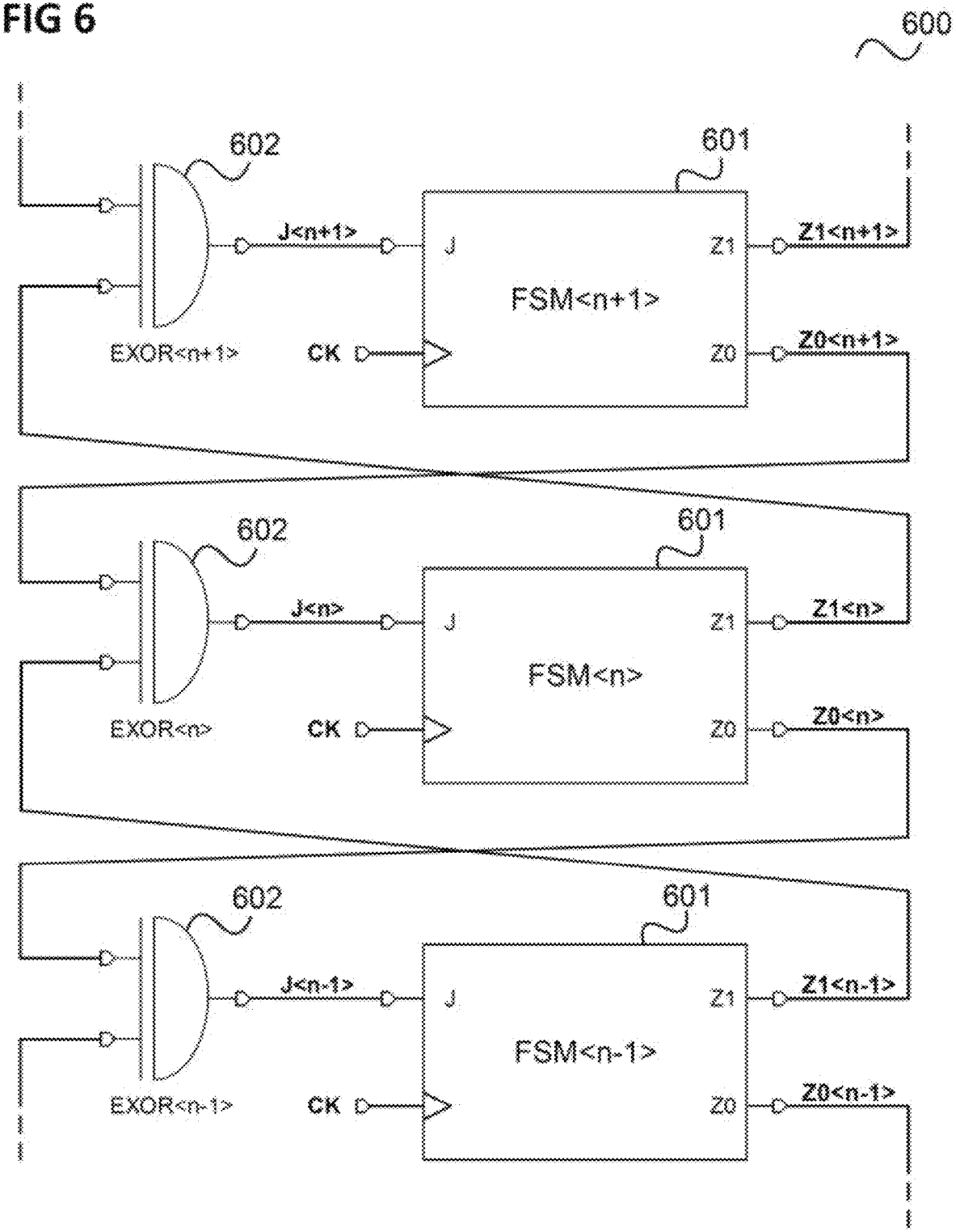
FIG. 6 shows a switching logic arrangement according to one embodiment.

This makes a successful reverse engineering of such switching logic complexes extremely difficult, highly risky (resulting in misinterpretations) and time-consuming. FIG. 6 shows an example of such a switching logic complex.

FIG. 6 shows a switching logic arrangement 600 in accordance with one embodiment.

The switching logic arrangement 600 comprises a plurality of switching logics 601, each corresponding to the switching logic 500 from FIG. 5 and arranged in a chain (according to an index n=1, 2, ... ). Accordingly, each switching logic (with index n) has an input control state J<n> and receives the clock signal CK. Alternatively and/or additionally, the output states of the respective MH gate 501 are output states Z0<n> and Z1<n> of the gate.

The input control state J<n> is arranged by a respective EXCLUSIVE-OR gate from the output state Z0<n+1> of the following switching logic and the output state Z1<n−1> of the previous switching logic.

Thus, the input control state J<n> of a switching logic 601 is formed from the EXCLUSIVE-OR logic operation of MH-X^4 outputs Z1 and Z0 from neighboring (in the chain) switching logics with indices n−1 and n+1.

The first switching logic and the last switching logic in the chain, which each have no neighbors on one side, can be supplied by this constant or the chain can be closed cyclically.

In the switching logic arrangement there is clearly a transfer of states in both directions (the chain upwards and the chain downwards). However, in other possible designs, it is also possible to transfer states in only one direction and/or to transfer an output to a switching logic further away in the chain.

In the following a more complex example of a switching logic is described, using the MH gate MH-X^4.

Figure 7:
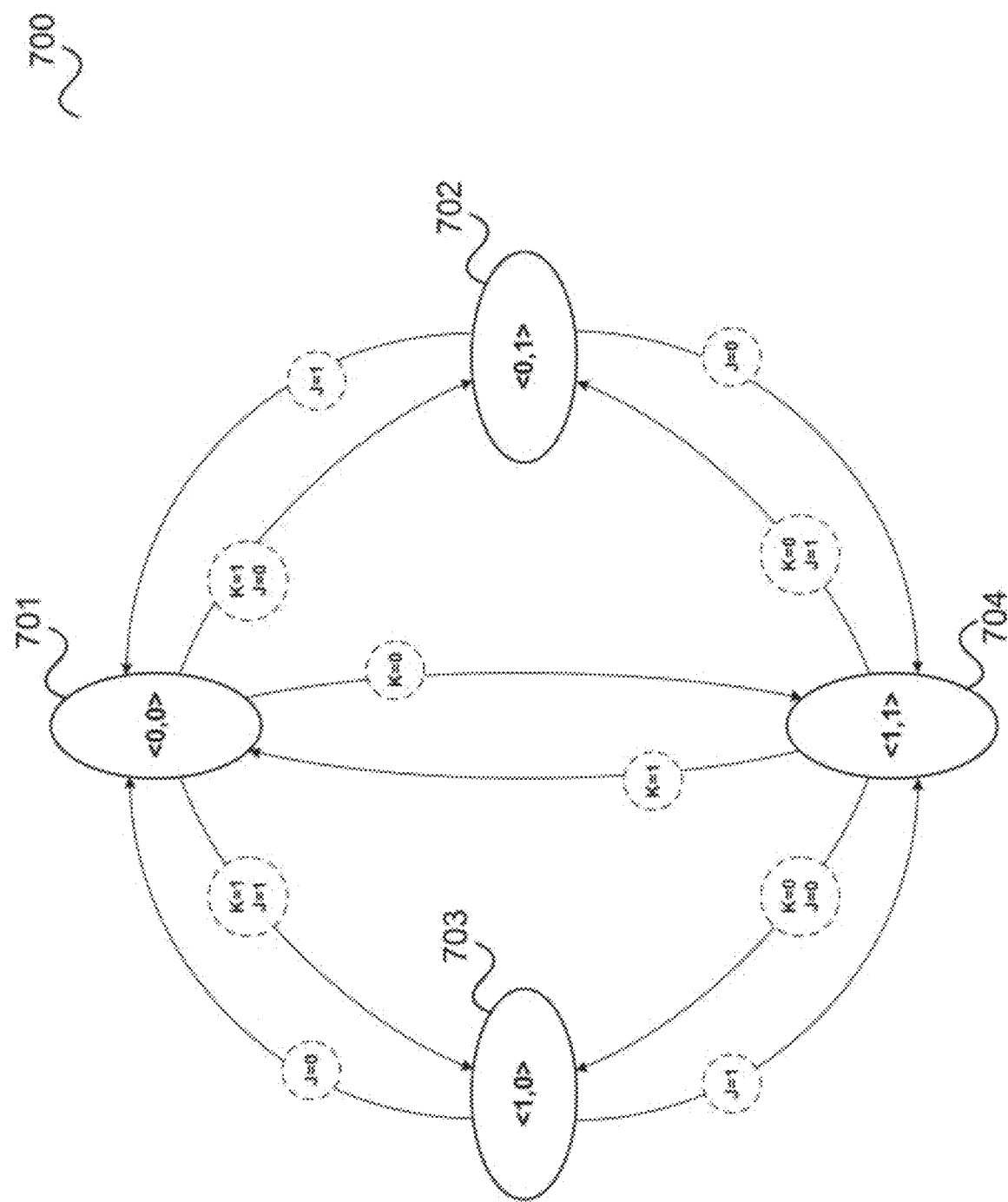
FIG. 7 shows a state diagram for a switching logic according to a further embodiment.

FIG. 7 shows a state diagram 700 for a switching logic according to a further embodiment.

In contrast to the example shown in FIG. 4, the switching logic has two control input states J and K.

The states <S1,S0>=<0,0>, <0,1>, <1,0>, <1,1> of the input states of MH-X^4 are interpreted as states 701, 702, 703, 704 of the corresponding switching logic with input states J and K.

The four possible states of <S1,S0> are represented by oval symbols as in FIG. 4, each containing one of the four possible values of <S1,S0>, while the conditions necessary on the input state J and K of the switching logic for the possible state transitions between states 701 to 704 are indicated within the dashed circles.

The state diagram also shows that the two disallowed input state transitions
<S1,S0>=<0,1>→<1,0> and <S1,S0>=<1,0>→<0,1>
are not realized by the corresponding switching logic.

Figure 8:
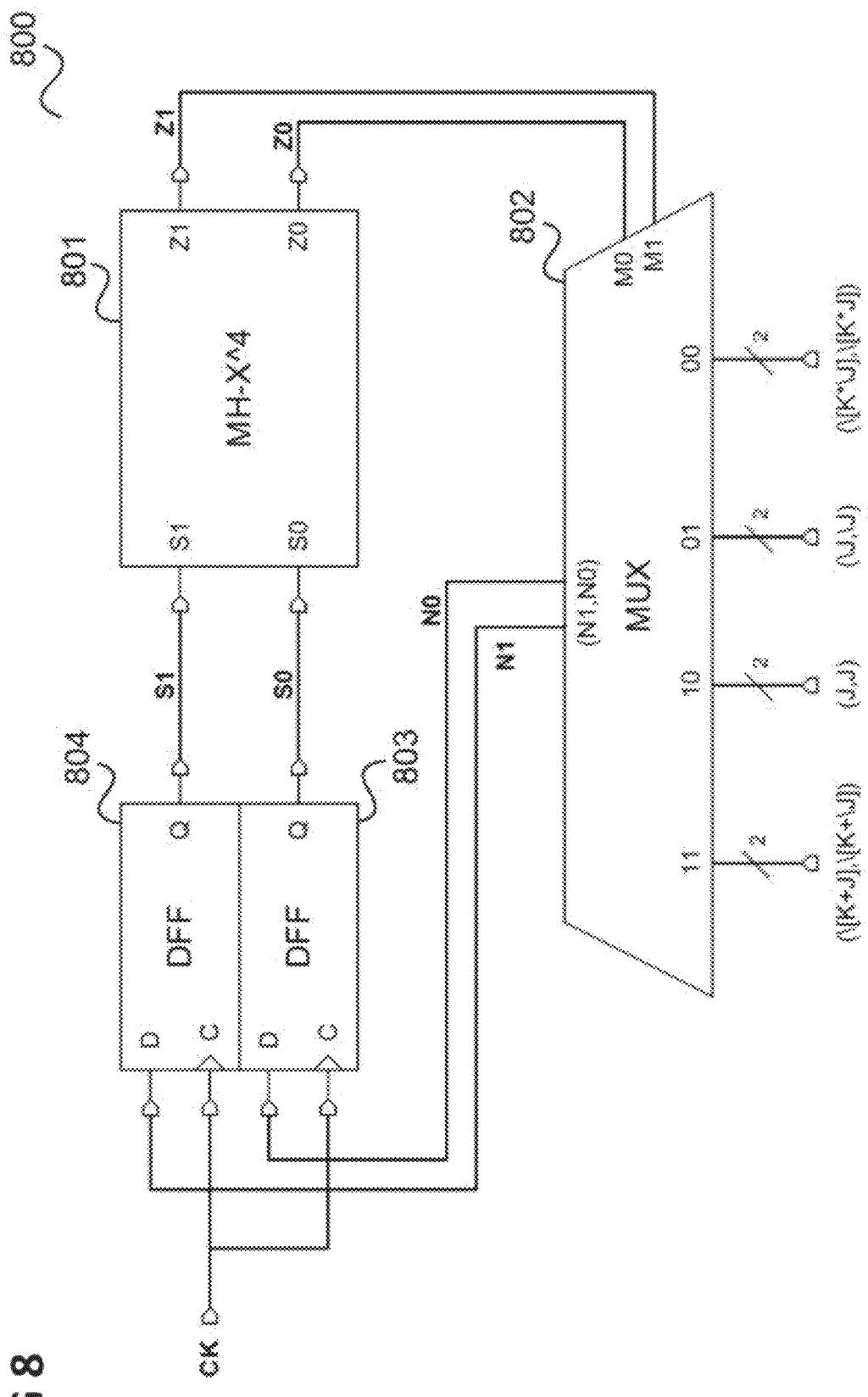
FIG. 8 shows a circuit for implementing a switching logic corresponding to the state diagram.

FIG. 8 shows a circuit (such as a switching logic) 800 for implementing a switching logic corresponding to the state diagram 700.

The circuit comprises an MH gate 801 (e.g., an MH gate MH-X^4), as shown in FIG. 2. The two outputs of the MH gate 801 are connected to control inputs M0 and M1 of a switching network 802, in this example a multiplexer MUX. The multiplexer has four data inputs that are assigned to the four possible bit combinations at the control inputs M0 and M1.

The circuit receives two control states and J and K. The combinations <\[K+J],\[K+J\J]>, <J,J>, <J,J> are fed to the data inputs of the multiplexer 802 in such a way that the following applies:
<Z1,Z0>=<1,1> implies <N1,N0>=<\[K+J],\[K+\J]>,
<Z1,Z0>=<1,0> implies <N1,N0>=<J,J>,
<Z1,Z0>=<0,1> implies <N1,N0>=<J,J>,
<Z1,Z0>=<0,0> implies <N1,N0>=<\[K*\J],\[K*J]>,
where N0 and N1 indicate the output states of the multiplexer 802.

The circuit 802 also comprises two flip-flops 803 and 804. The flip-flops 803 and 804 may be clock-edge-controlled data flip-flops. Both flip-flops 803 and 804 receive a clock signal CK at their respective clock input. The first flip-flop 803 receives the output state N0 of the multiplexer 802 and the second flip-flop 804 receives the output state N1 of the multiplexer 802. The value stored by the first flip-flop 803 is the input state S0 of the MH gate 801 and the value stored by the second flip-flop 804 is the input state S1 of the MH gate 801.

The input control states J and K of the switching logic under consideration can change within each period of the system clock CK. For example, J and K can be derived from outputs Z1 and Z0 of other MH-X^4 gates from another switching logic, which is similar or identical in design.

In this way, arbitrarily complex arrangements of switching logics of the type under consideration can be set up, wherein one, some and/or all state transitions in one, some and/or all switching logics depend on one, some and/or all Boolean secrets hidden in the MH-X^4.

This makes a successful reverse engineering of such switching logic complexes extremely difficult, highly risky (resulting in misinterpretations) and time-consuming. For example, the switching logic 800 from FIG. 8 can be used in the switching logic arrangement 600 of FIG. 6, analogous to the switching logic 500 from FIG. 5.

Figure 9:
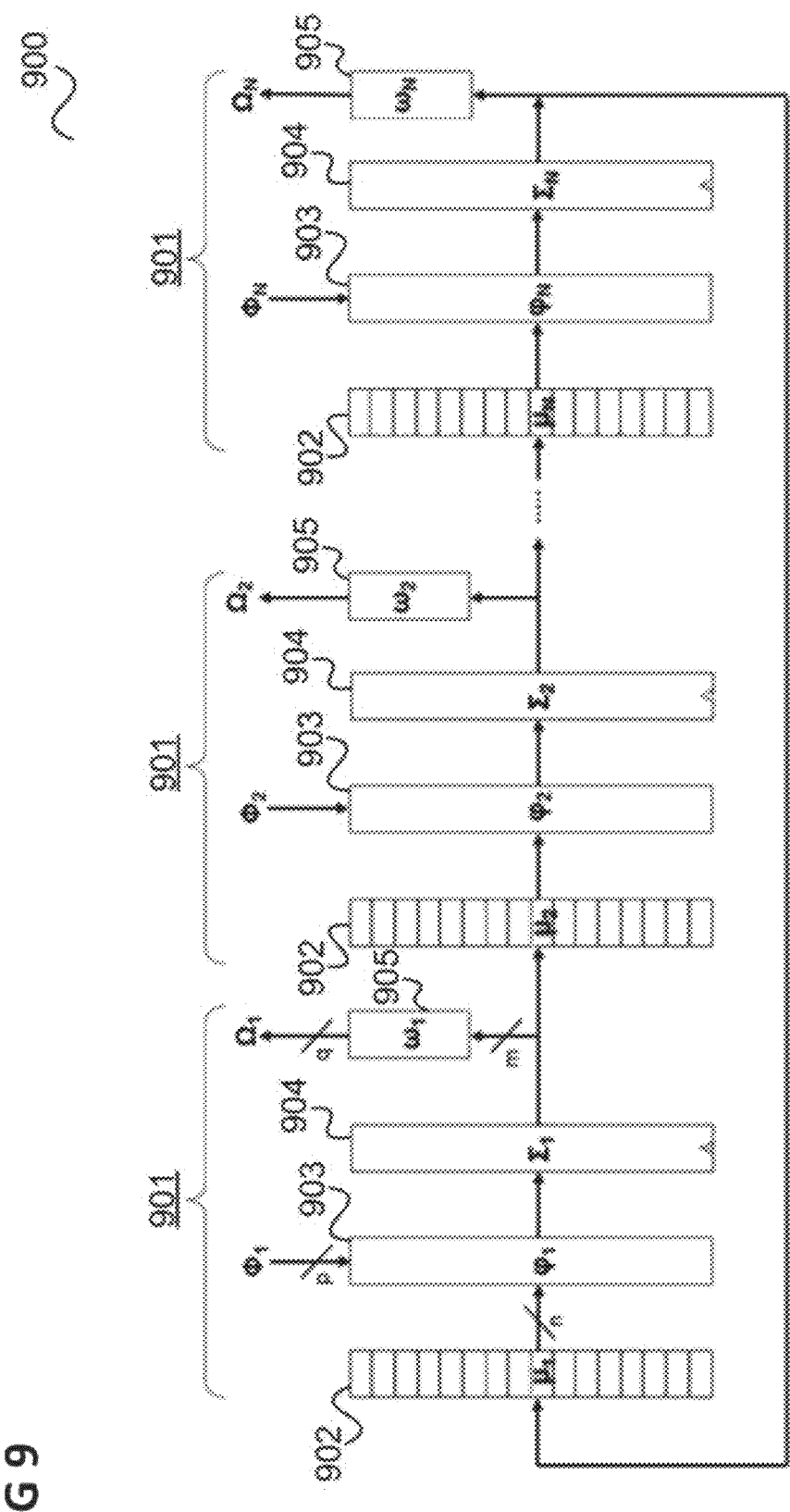
FIG. 9 shows a general structure of a finite automaton that is protected from reverse engineering using cells that represent Boolean secrets.

FIG. 9 shows a general structure of a finite automaton 900 which is protected against reverse engineering (i.e., its confidentiality is protected) using cells (such as gates) that represent Boolean secrets (e.g., MH gates).

The finite automaton 900 has several stages (or layers) 901, numbered from 1 to N.

Each stage 901 comprises a daisy chain of an MH layer 902 (labeled as µ), a combination layer 903 (labeled as φ), and a sequential (state) layer 904 (which stores a state of the stage labeled as Σ).

The MH layer 902 comprises one or more MH gates (sequential and/or parallel), the combination layer 903 is a switching network, for example, and the sequential layer 904 is a buffer layer, e.g., formed by one or more flip-flops.

The output of the sequential layer 904 of a stage 901 is connected to the input of the MH layer 902 of the subsequent stage 901, wherein the stages 901 are cyclically connected to each other, in other words the output of the sequential layer 904 of the Nth stage is connected to the input of the MH layer 902 of the first stage.

The output of the sequential layer 904 of each stage 901 is also connected to a respective output layer 905 (labeled as w), which generates an output (labeled as S2) and outputs it, for example, to a circuit connected to the finite automaton 900 (which is located, for example, on the same chip as the circuit which implements the finite automaton 900).

Therefore, between each sequential layer 904 and combinatorial layer 903 (the next stage), an MH layer 902 is located which transforms the state of the sequential layer 904 (for example, a set of binary states) according to secrets that represent one or more MH cells of the MH layer. The combination layer 903 of each stage 901 thus operates on secret data and the output layer 905 has a secret input and generates the secret output Ω.

As an option, the finite automaton 900 can have one or more feedback paths (i.e. feedback loops) in order to implement a desired behavior (states and state transitions of the automaton). In the example of FIG. 9, there is a large feedback loop due to the connection of the N-th stage to the first stage, as explained above.

The finite automaton 900 can receive inputs (e.g., input control signals), labeled in FIG. 9 as 1, by means of one or more of the combinatorial layers 903. These inputs, which are acquired from one or more of the combinatorial layers 903, can be used, for example, to control and/or effect state transitions of the automaton 900.

The k-th stage (k=1, ..., N) therefore contains
a state $\Sigma_k$ with $n_k$ bits,
(optionally) an input $\Phi_k$ with $p_k$ bits and
an output $\Omega_k$ with $q_k$ bits.

The finite automaton 900 can be regarded as a generalization of the switching logics 500, 800 from FIGS. 5 and 8, for example as follows: N=1, the MH layer consists of the one MH gate 501, 801, the combinatorial layer consists of the multiplexer 502, 802 and the sequential layer consists of the flip-flops 503, 504, 803, 804. For example, S1 and/or S0 can be output.

The finite automaton 900 can also be considered as a generalization of the switching logic arrangement 600, for example because an EXCLUSIVE OR gate 602 together with the multiplexer of a switching logic 601 is considered as a combinatorial layer of a stage, the flip-flops of a switching logic 601 as a sequential layer of the stage and the MH gate of the switching logic 601 as an MH layer of the subsequent stage. In this interpretation, there is feedback from the MH layer of each stage to the combinatorial layer of the stage, which is two stages ahead (due to the feedback of Z0).

By means of the multi-layer structure, as shown in FIG. 9, in principle any finite automaton can be represented with N states.

The following describes some example applications for protecting against reverse engineering.

As a first example application, the secret outputs Ω1, Ω2, ... (e.g., over several clock pulses) are used as the control information sequence for an algorithm.

For example, redundant coding is currently typically used for integrity protection. However, reverse engineering allows an attacker to discover the exact positions and values needed to force a valid (but malicious) state transition. Using an MH-protected state machine, such as described in FIG. 9 for example, it can be ensured that an attacker cannot discover any valid state coding and/or valid state transitions through reverse engineering. The attacker would therefore have to inject faults on a trial-and-error basis and/or intercept all states and registers (e.g., flip-flops) of the state machine. This greatly increases the effort required by the attacker.

For example, the controller of an (e.g., proprietary) cryptographic algorithm can be implemented using an MH-protected state machine.

As a first example application, the secret outputs $\Omega_1$, $\Omega_2$, ... (e.g., over several clock pulses) are used as a sequence of cryptographic keys. For example, a set $\Omega_1$, $\Omega_2$, ..., $\Omega_N$ represents a cryptographic key and, after a specific number of cycles, the next cryptographic key of the sequence. A state machine 901 with only one stage can also be taken, which outputs a cryptographic key (optionally parts of the key over several clock cycles).

The basis for protecting the confidentiality and integrity on a (security) controller is typically a secret value used in key-dependent cryptographic functions, also known as a Root Key. Such key-dependent cryptographic functions include, for example, encryption algorithms which are used to provide the secrecy of a memory, for authentication algorithms to control access to content and/or functions, and integrity protection algorithms (MAC, AE) designed to ensure the integrity of memory contents and/or other functions. Typically, the root key R should be protected from extraction by reverse engineering (as this would allow the production of cloned chips). Therefore, this key is a natural candidate for protection in an implementation using a circuit camouflage technique.

A standard IC manufacturing process typically produces a large number of identical copies of the IC. However, most security applications require IC-specific root keys. This conflicts with the static nature of the circuit camouflage, because a camouflage circuit that generates the root key would be identical on identical ICs.

To resolve this conflict, another IC-specific secret value, herein referred to as IV, may be introduced and stored in a non-volatile memory (NVM) of the IC for this purpose. The IC-specific value IV can be combined with fixed component values (identical for some and/or all of the ICs), which are stored, for example, in a ROM (read-only memory) and/or a semi-custom chip area.

However, in many cases, the non-volatile memory must be considered insecure, which means it must be assumed that its contents can be extracted in a reverse engineering attack, as is the case with ROM and semi-custom blocks. This approach allows an attacker to produce a clone of the IC.

According to one embodiment, this is prevented by the IC-specific value IV, which is stored in a non-volatile memory, being transformed by using a state machine in accordance with FIG. 9, by setting Φ=IV and Ω=R. This constitutes a protected key generator that generates an IC-specific key R based on the (not necessarily secret) value IV. This is shown in FIG. 10.

Figure 10:
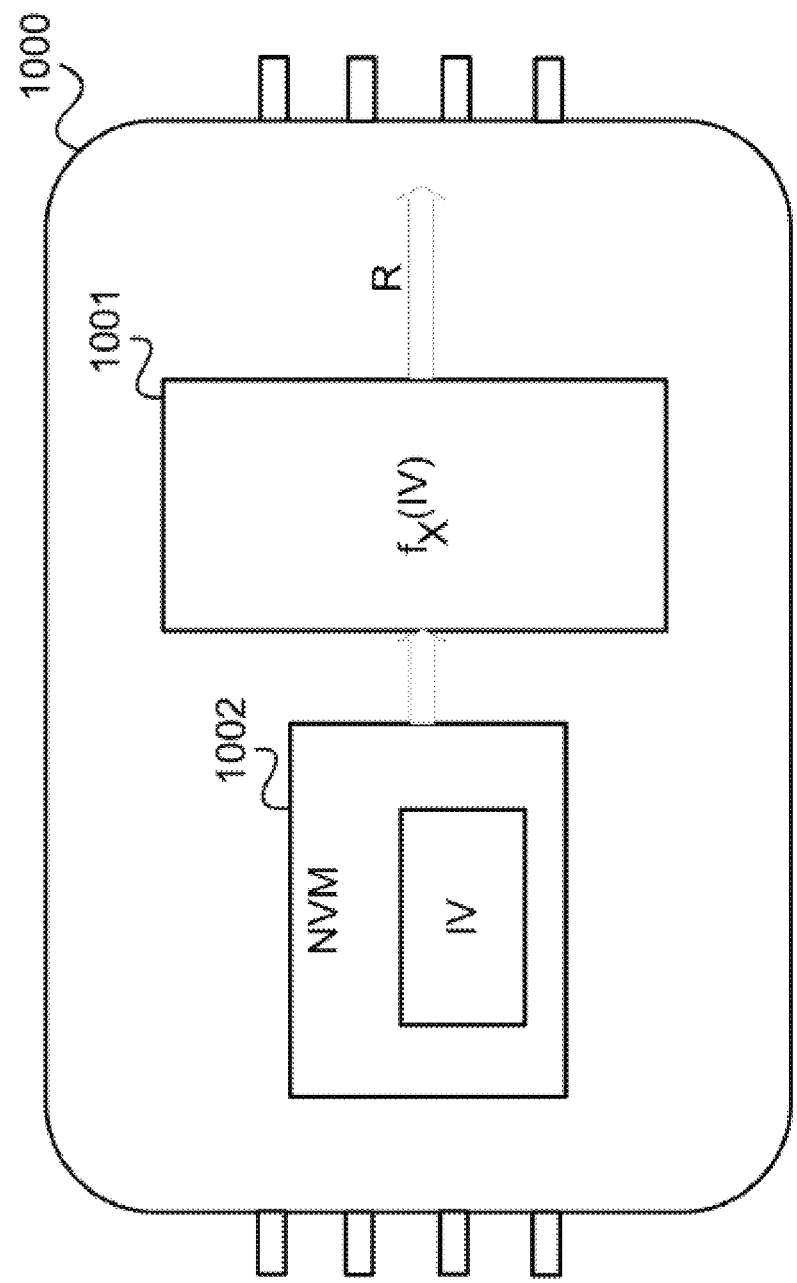
FIG. 10 shows a chip according to one embodiment.

FIG. 10 shows a chip 1000 according to one embodiment.

The chip 1000 comprises a state machine 1001, which comprises MH gates, for example, as described with reference to FIG. 9. The chip also comprises a non-volatile memory 1002, which stores a (for example, public, i.e. not secret) information item IV. The state machine 1001 receives the information IV and generates a key (e.g., a root key) R, according to a function $f_X$ (IV), which is specific to the chip 1000, because the MH gates are individually configured for the chip (i.e. represent chip-specific secrets). X can be a static key, which can also be protected against reverse engineering by means of a camouflage circuit and which is input into the function $f_X$(IV). For example, the secret function $f_X$(.) is chosen such that it avoids collisions, in the sense that for input tuples (IV, X), the probability that the function $f_X$(IV)=f(X, IV) of another chip will generate the same root key is vanishingly small (e.g., the probability may be less than a threshold probability) (for example, it is acceptable for the particular application scenario).

The state machine is the state machine of FIG. 9, for example, with one stage and Φ=IV and Ω=R, and implements a key generator protected against reverse engineering. For example, the generated chip-specific key R is used by the chip 1000 for memory encryption, for secure data transmission and/or for authentication.

Integrity protection is achieved in this example because forcing input control states of the state machine 1001 to specific values will generally result in impermissible input state transitions and an incorrect (or random) key. Protection against reverse engineering results from the use of the state machine 1001, which is protected by MH gates.

As a generalization, a state machine 1001 with a plurality of stages 901 can be used, such that a sequence (or set) of cryptographic keys is generated by the state machine 1001 (e.g., one per stage). The state machine 1001 can output one key at a time in deterministic order (i.e. it does not omit any key and does not generate an earlier key). Suitable coding can be used to ensure that this also remains valid even in the event of fault attacks. For this purpose, the coding can exploit the fact that an MH cell no longer outputs any secret that it represents if its input is set to an impermissible state (or an invalid state transition).

For example, the function $f_X$(IV) is selected to cause a strong mixture of X and IV. For example, it can have the properties of a key-based hash function. The length of the value IV (i.e. the number of bits) is selected in such a way that it results in sufficient diversity.

Using static reverse engineering together with extraction of IV from the non-volatile memory 1002, an attacker cannot determine the secret key R (assuming a strong camouflage technology, such as can be obtained by means of MH gates). Thus, the attacker cannot create a cloned IC (i.e. chip) with the root key R, because they do not know the root key R and cannot calculate the root key R from knowledge of the value IV, because they do not know the unknown function $f_X$(.) and cannot copy it.

However, another attack to clone the 1000 chip is possible: assuming that the value IV can be extracted by reverse engineering, an attacker can take another identical chip from the manufacturer and try to inject the value IV into the other chip. This is typically difficult, but may be possible for a powerful attacker. This allows the attacker to perform a one-to-one identity transfer, but they must sacrifice an original IC for each cloned IC that is produced. A mass production of cloned ICs is therefore not possible for the attacker, which may be sufficient for many applications.

In order to achieve full clone protection, according to one embodiment the non-volatile memory of the IC-specific value IV is provided with write-locking and/or one-time programmability (OTP) functionality. This is shown in FIG. 11.

Figure 11:
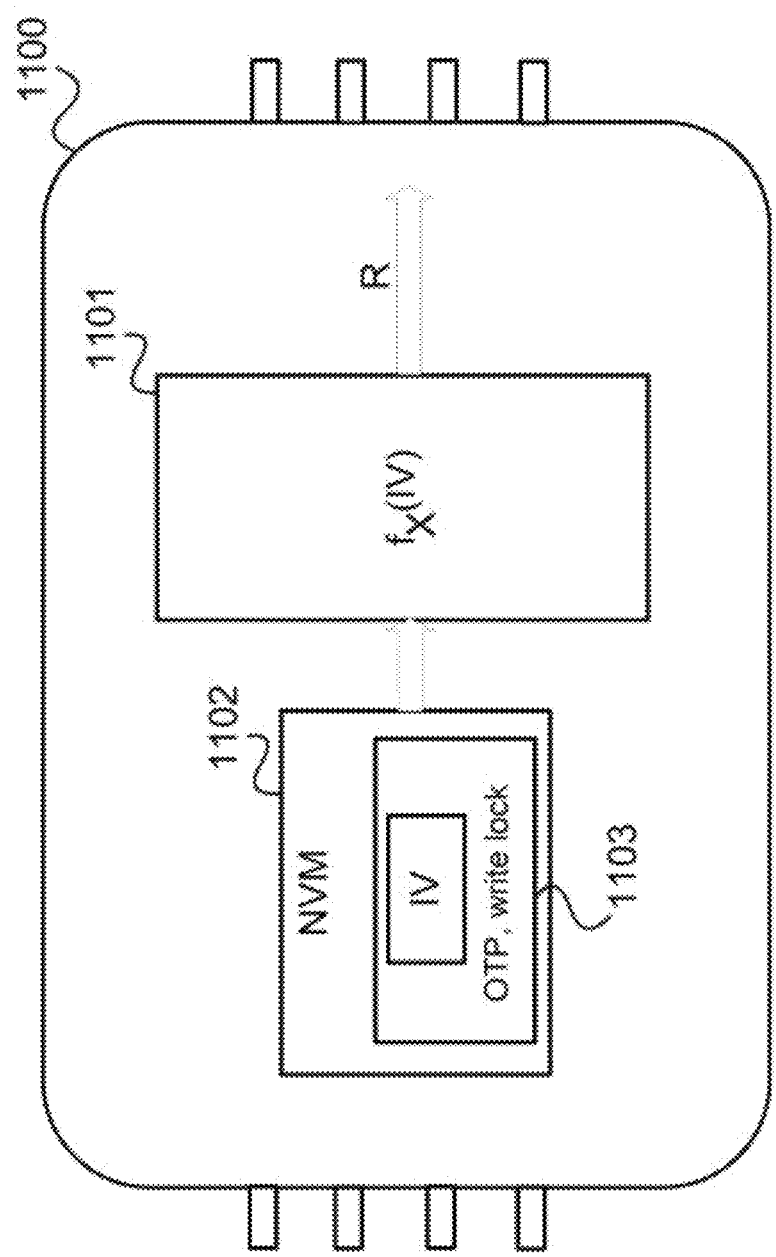
FIG. 11 shows a chip according to a further embodiment.

FIG. 11 shows a chip 1100 according to a further embodiment.

According to the chip 1000 of FIG. 10, the chip 1100 comprises a state machine 1101 and a non-volatile memory 1102. The non-volatile memory 1102 is provided with OTP functionality and/or a write lock 1103.

In a personalization act (such as after the hardware manufacture of the chip 1100), the value IV is written to the non-volatile memory 1102 and any further writing to the memory area that stores the value IV (i.e. overwriting the value IV) is prevented (blocked) by the OTP functionality and/or write lock 1103.

OTP functionality 1103 is not limited to a classical NVM-OTP functionality. It can be any single-use functionality, such as a specialized procedure that allows only one-time programming and/or that has a physically irreversible locking act (such as semiconductor fuses, laser fuses, etc.). As explained above, the value IV does not need to be kept secret. The combination of a camouflage technology with storage of the value IV such that it can only be written once, as provided by the example of FIG. 11, enables complete protection against cloning and the security of the root key.

A protected and controlled unlocking functionality can be provided to allow reprogramming of IV (when using a write lock instead of an OTP functionality).

The secret function $f_X$(.) can be a (e.g., common) cryptographic hash function, an AE (authenticated encryption) function, a MAC (Message Authentication Code) function, and/or other dedicated function that prevents an attacker from deriving and/or guessing the value of the root key R from the input values.

The secret function $f_x(.)$ can be implemented using countermeasures against side-channel attacks and/or fault attacks, depending on the accessibility of the value IV to an attacker.

As a third example application, the secret outputs Ω1, Ω2, . . . (e.g., over several cycles) are used as a pseudo-random sequence for masking data for protection (countermeasure) against side-channel attacks and differential fault analysis. The input 1 in this case can be a true random sequence.

A linear or non-linear shift register can be implemented by providing Φ as a linear or non-linear transition function. The shift register passes through a sequence of values that cannot be predicted by an attacker performing a reverse engineering.

Figure 12:
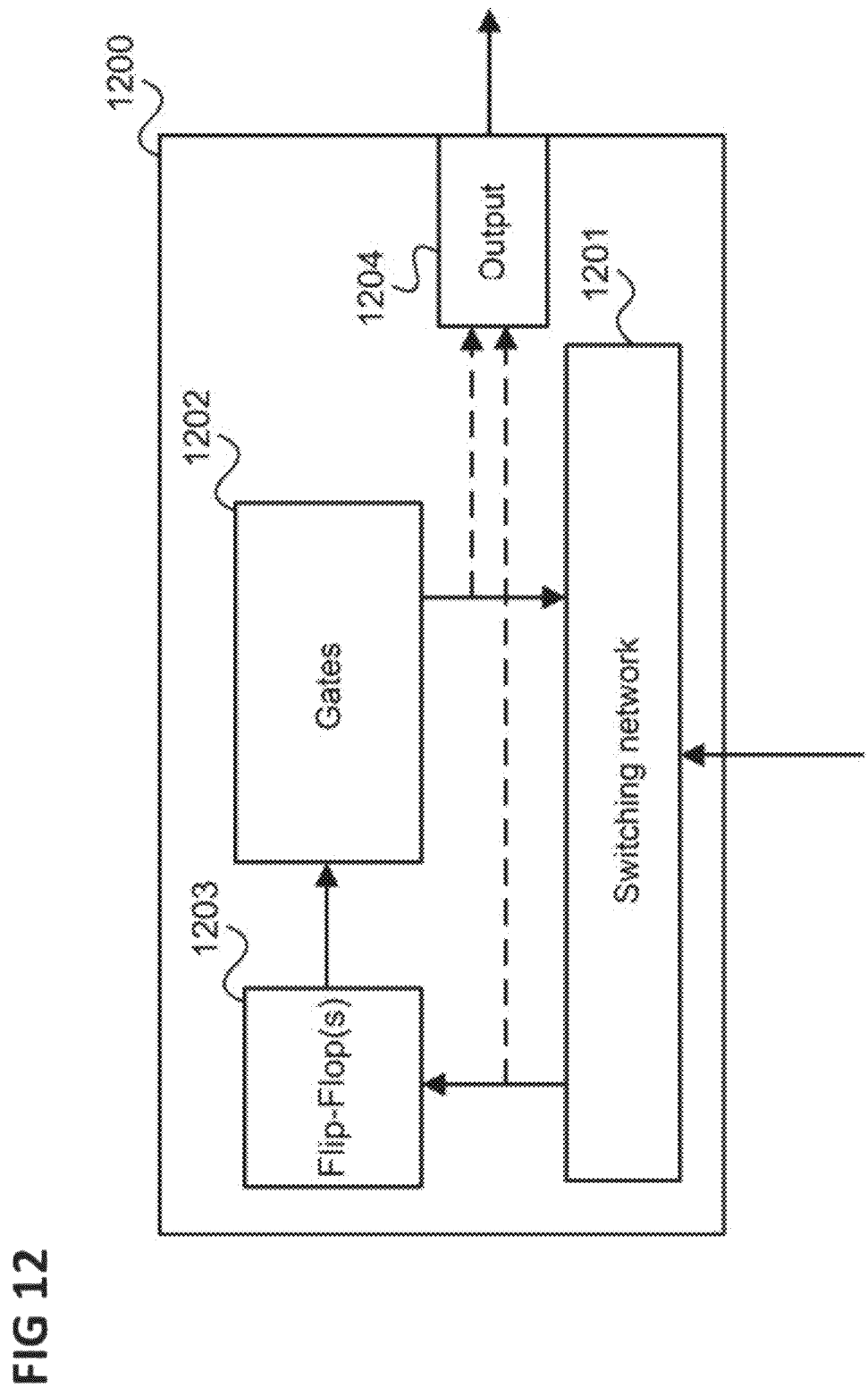
FIG. 12 shows an integrated electronic circuit according to one embodiment.

In summary, according to various exemplary embodiments an integrated electronic circuit is provided, as shown in FIG. 12.

FIG. 12 shows an integrated electronic circuit 1200 according to one embodiment.

The integrated electronic circuit 1200 comprises a switching network 1201 which is configured to receive binary control states.

The integrated electronic circuit 1200 also comprises one or more secret-carrying gates 1202, wherein each secret-carrying gate 1202 represents Boolean secrets and is configured to receive binary input states and to output at least one of the Boolean secrets according to a state sequence (i.e. a chronological sequence of states) of the binary input states.

Alternatively and/or additionally, the integrated electronic circuit 1200 comprises one or more flip-flops 1203 which are configured to store binary output states output by the switching network 1201 and to supply binary input states to the one or more secret-carrying gates based on the stored binary output states.

The switching network 1201 is configured to generate the binary output states by combining the binary control states and Boolean secrets output by the one or more secret-carrying gates.

The integrated electronic circuit 1200 also has an output 1204 which is configured to output Boolean secrets output by the one or more secret-carrying gates and/or binary output states output by the switching network 1201 to another integrated electronic circuit.

In other words, according to different embodiments, a switching logic is provided in an integrated circuit (e.g., on a chip), which comprises one or more secret-carrying gates (i.e. camouflage circuit such as MH gate). Output secrets are processed and supplied to the secret gates once again, such that the integrated circuit passes through a secret sequence of (logic) states.

The integrated electronic circuit thus implements a finite automaton. According to different embodiments, protection of a finite automaton against reverse engineering is thus achieved based on one or more secret-carrying cells (such as gates), each of which can carry and/or supply one or more Boolean secrets. An example of such secret-carrying cells is that of MH cells. However, it should be noted that a plurality of MH cells can be connected in succession to form a chain, such that the secret output by the chain in response to a state transition depends on a sequence of (more than one) previous state transitions. Since the current output value of an MH cell for (one or more) current input states (also) depends on the (one or more) immediately preceding input states, such that an MH cell apparently looks back one clock cycle in the past, by concatenating multiple MH cells it is possible to look back multiple clock cycles into the past.

For example, the output of the integrated circuit is a binary output with one or more bit lines. The states output from the output can be used by the other integrated circuit in different ways, e.g., as control information (e.g., control bits and/or control bit sequence), as part of a cryptographic key, etc.

A state that is supplied to a circuit and/or circuit component can be understood as a logic state. A signal can represent one or more states (over time). A state sequence is thus, for example, a signal that can change its logic level (typically 1 or 0) over time and can thus represent changing logic states.

In the following text various exemplary embodiments are specified.

Exemplary embodiment 1 is an integrated electronic circuit, as shown in FIG. 12.

Exemplary embodiment 2 is an integrated circuit as defined in exemplary embodiment 1, wherein the switching network implements a multiplexer.

Exemplary embodiment 3 is an integrated circuit as defined in exemplary embodiment 2, wherein the Boolean secrets output by the one or more secret-carrying gates control which binary control states are output by the multiplexer as binary output states.

Exemplary embodiment 4 is an integrated circuit as defined in any one of exemplary embodiments 1 to 3, wherein each secret-carrying gate comprises a plurality of field-effect transistor pairs connected in such a way that in response to a first transition from a first binary state of two nodes of the secret-carrying gate and in response to a second transition from a second binary state of the nodes of the secret-carrying gate, the nodes each have an undefined binary logic state if for each field-effect transistor pair the threshold voltages of the field-effect transistors of the field-effect transistor pair are equal, and the threshold voltages of the field-effect transistors of the field-effect transistor pairs are defined in such a way that the nodes each have one predefined binary logic state in response to the first transition and in response to the second transition.

Exemplary embodiment 5 is an integrated circuit as defined in any one of exemplary embodiments 1 to 3, wherein each secret-carrying gate comprises a plurality of field-effect transistor pairs configured such that (e.g., the plurality of field-effect transistor pairs may be connected in such a way that) in response to a first transition from a first binary input state of two input nodes of the secret-carrying gate and/or a second transition from a second binary input state of the input nodes of the secret-carrying gate, one of: if for each field-effect transistor pair of the plurality of field-effect transistor pairs, threshold voltages of the field-effect transistors of the field-effect transistor pair are equal, output nodes of the secret-carrying gate each have an undefined binary output state; or if for each field-effect transistor pair of one or more field-effect transistor pairs of the plurality of field-effect transistor pairs, threshold voltages of the field-effect transistors of the field-effect transistor pair are not equal, the output nodes each have one predefined binary output state based on threshold voltages of the field-effect transistors of the field-effect transistor pair (e.g., threshold voltages of field-effect transistors of the plurality of field-effect transistor pairs may be defined such that the output nodes each have one predefined binary output state in response to the first transition and/or the second transition).

Exemplary embodiment 6 is an integrated circuit as defined in exemplary embodiment 4 or 5, wherein Boolean secrets (e.g., Boolean secrets represented by a secret-carrying gate of the one or more secret-carrying gates) are predefined binary output states (e.g., predefined binary output states of output nodes of the secret-carrying gate).

Exemplary embodiment 7 is an integrated circuit as defined in any one of exemplary embodiments 4 to 6, wherein the secret-carrying gate has one or more pairs of competing paths, such that for each field-effect transistor pair, the two field-effect transistors of the field-effect transistor pair are located in different competing paths of a pair of competing paths.

Exemplary embodiment 8 is a chip having at least one integrated circuit as defined in any one of exemplary embodiments 1 to 7.

Exemplary embodiment 9 is a chip as defined in exemplary embodiment 8, having a plurality of integrated circuits as defined in any one of exemplary embodiments 1 to 7, in which a signal which is output from the output of a second one of the integrated circuits is fed to a first one of the integrated circuits.

Exemplary embodiment 10 is a chip as defined in exemplary embodiment 9, comprising a combination circuit configured to generate the binary control states of the first integrated circuit based on the signal output by the output of the second integrated circuit.

Exemplary embodiment 11 is a chip as defined in exemplary embodiment 9 or 10, in which a signal output by the output of the first integrated circuit is fed to the second integrated circuit.

Exemplary embodiment 12 is a chip as defined in exemplary embodiment 11, comprising a combination circuit configured to generate the binary control states of the second integrated circuit based on the signal output from the output of the first integrated circuit.

Exemplary embodiment 13 is a chip as defined in any one of exemplary embodiments 9 to 12, having a chain of integrated circuits formed by the plurality of integrated circuits, in which a signal output from the output of a preceding integrated circuit in the chain is fed to a following integrated circuit in the chain.

Exemplary embodiment 14 is a chip as defined in exemplary embodiment 13, wherein the following integrated circuit is supplied with the signal output from the output of the preceding integrated circuit as one or more of the binary control states and/or one or more binary states to be combined with stored binary output states (e.g., binary output states that are stored by memory of the chip and/or that are stored by the following integrated electronic circuit).

Exemplary embodiment 15 is a chip as defined in exemplary embodiment 13 or 3, in which a signal output from the output of the following integrated circuit in the chain is fed to the preceding integrated circuit in the chain.

Exemplary embodiment 16 is a chip as defined in exemplary embodiment 15, wherein the preceding integrated circuit is supplied with the signal output from the output of the following integrated circuit as one or more of the binary control states and/or one or more binary states to be combined with stored binary output states (e.g., binary output states that are stored by memory of the chip and/or that are stored by the preceding integrated circuit).

Exemplary embodiment 17 is a chip as defined in either of the exemplary embodiments 13 or 16, in which at least one of the integrated circuits in the chain is supplied with a signal output from the output of the following integrated circuit in the chain and a signal output from the output of the preceding integrated circuit in the chain.

Exemplary embodiment 18 is a chip as defined in exemplary embodiment 17, wherein the at least one integrated circuit is supplied with the signal output from the output of the following integrated circuit and with the signal output from the output of the preceding integrated circuit as one or more of the binary control states and/or one or more binary states to be combined with stored binary output states (e.g., binary output states that are stored by memory of the chip and/or that are stored by the at least one integrated circuit).

Exemplary embodiment 19 is a chip as defined in any one of exemplary embodiments 8 to 15, having a non-volatile memory that stores a value and is configured to supply the at least one integrated circuit with one or more of the binary control states and/or one or more binary states to be combined with stored binary output states (e.g., binary output states that are stored by the non-volatile memory and/or that are stored by the at least one integrated circuit). The non-volatile memory may be configured to supply the at least one integrated circuit with the one or more of the binary control states and/or the one or more binary states based on the value. Alternatively and/or additionally, the one or more of the binary control states and/or the one or more binary states may be combined with the stored binary output states based on the value.

Exemplary embodiment 20 is a chip as defined in exemplary embodiment 19, wherein the memory has a locking mechanism such that the memory can only be written to once.

Exemplary embodiment 21 is a chip as defined in exemplary embodiment 19 or 20, wherein the value is a chip-specific secret value.

Exemplary embodiment 22 is a chip as defined in any one of exemplary embodiments 8 to 21, having a processing circuit, wherein the output of at least one of the integrated circuits is configured to output Boolean secrets output by the one or more secret-carrying gates and/or binary output states output by the switching network to the processing circuit, and the processing circuit is configured to use a sequence of binary states received from the at least one integrated circuit as a cryptographic key.

According to one exemplary embodiment, an integrated electronic circuit is provided. The integrated electronic circuit may comprise a switching network configured to receive one or more control states. The integrated electronic circuit may comprise one or more secret-carrying gates, wherein each secret-carrying gate represents one or more Boolean secrets and is configured to receive one or more input signals and to output at least one of the Boolean secrets according to a chronological state sequence of the one or more input signals, and one or more flip-flops which are configured to store one or more binary output states output by the switching network and to supply binary input states to the one or more secret-carrying gates as the input signal or the plurality of input signals, wherein the switching network is configured to generate the one or more output signals by combining the one or more control signals and one or more of the Boolean secrets output by the one or more secret-carrying gates. The integrated electronic circuit may comprise an output configured to output one or more of the Boolean secrets output by the one or more secret-carrying gates, or one or more output signals output by the switching network, to another integrated electronic circuit.

Although the present disclosure has mainly been shown and described by reference to specific embodiments, it should be understood by those familiar with the technical field that numerous changes can be made with regard to its design and details without departing from the nature and scope of the present disclosure, as defined by the following claims. The scope of the present disclosure is therefore defined by the attached claims and it is intended that any changes that fall within the literal meaning or equivalent scope of the claims are included.

It may be appreciated that combinations of one or more embodiments described herein, including combinations of embodiments described with respect to different figures, are contemplated herein.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

Any aspect or design described herein as an "example" is not necessarily to be construed as advantageous over other aspects or designs. Rather, use of the word "example" is intended to present one possible aspect and/or implementation that may pertain to the techniques presented herein. Such examples are not necessary for such techniques or intended to be limiting. Various embodiments of such techniques may include such an example, alone or in combination with other features, and/or may vary and/or omit the illustrated example.

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims may generally be construed to mean "one or more" unless specified otherwise or clear from context to be directed to a singular form. Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated example implementations of the disclosure. In addition, while a particular feature of the disclosure may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

While the subject matter has been described with reference to illustrative embodiments, this description is not intended to be construed in a limiting sense. Various modifications and combinations of the illustrative embodiments, as well as other embodiments of the present disclosure, will be apparent to persons skilled in the art upon reference to the description. It is therefore intended that the appended claims encompass any such modifications or embodiments.

The invention claimed is:

1. An integrated electronic circuit, comprising:
   a switching network configured to receive binary control states;
   one or more secret-carrying gates, wherein each secret-carrying gate of the one or more secret-carrying gates represents Boolean secrets and is configured to receive binary input states and to output one or more Boolean secrets of the Boolean secrets according to a state sequence of the binary input states;
   one or more flip-flops configured to store binary output states output by the switching network, and to supply binary input states to the one or more secret-carrying gates based on the binary output states, wherein the switching network is configured to combine the binary control states and a plurality of Boolean secrets output by the one or more secret-carrying gates to generate the binary output states, wherein the plurality of Boolean secrets comprise the one or more Boolean secrets output by each secret-carrying gate; and
   an output configured to output at least one of the plurality of Boolean secrets output by the one or more secret-carrying gates or the binary output states output by the switching network to another integrated electronic circuit.

2. The integrated electronic circuit of claim 1, wherein the switching network implements a multiplexer.

3. The integrated electronic circuit of claim 2, wherein the plurality of Boolean secrets output by the one or more secret-carrying gates control which binary control states are output by the multiplexer as one or more binary output states.

4. The integrated electronic circuit of claim 1, wherein:
   each secret-carrying gate of the one or more secret-carrying gates comprises a plurality of field-effect transistor pairs configured such that in response to at least one of:
      a first transition from a first binary input state of two input nodes of the secret-carrying gate; or
      a second transition from a second binary input state of the input nodes of the secret-carrying gate,
   one of:
      if for each field-effect transistor pair of the plurality of field-effect transistor pairs, threshold voltages of the field-effect transistors of the field-effect transistor pair are equal, output nodes of the secret-carrying gate each have an undefined binary output state; or
      if for each field-effect transistor pair of one or more field-effect transistor pairs of the plurality of field-effect transistor pairs, threshold voltages of the field-effect transistors of the field-effect transistor pair are not equal, the output nodes each have one predefined binary output state based on threshold voltages of the field-effect transistors of the field-effect transistor pair.

5. The integrated electronic circuit of claim 4, wherein Boolean secrets represented by a secret-carrying gate of the one or more secret-carrying gates are predefined binary output states of output nodes of the secret-carrying gate.

6. The integrated electronic circuit of claim 4, wherein the secret-carrying gate has one or more pairs of competing paths such that for each field-effect transistor pair, the field-effect transistors of the field-effect transistor pair are located in different competing paths of a pair of competing paths.

7. A chip, comprising:
one or more integrated electronic circuits, wherein each integrated electronic circuit of the one or more integrated electronic circuits comprises:
a switching network configured to receive binary control states;
one or more secret-carrying gates, wherein each secret-carrying gate of the one or more secret-carrying gates represents Boolean secrets and is configured to receive binary input states and to output one or more Boolean secrets of the Boolean secrets according to a state sequence of the binary input states;
one or more flip-flops configured to store binary output states output by the switching network, and to supply binary input states to the one or more secret-carrying gates based on the binary output states, wherein the switching network is configured to combine the binary control states and a plurality of Boolean secrets output by the one or more secret-carrying gates to generate the binary output states, wherein the plurality of Boolean secrets comprise the one or more Boolean secrets output by each secret-carrying gate; and
an output configured to output at least one of the plurality of Boolean secrets output by the one or more secret-carrying gates or the binary output states output by the switching network to another integrated electronic circuit.

8. The chip of claim 7, wherein:
the one or more integrated electronic circuits comprise a first integrated electronic circuit and a second integrated electronic circuit;
the second integrated electronic circuit is configured to output a signal via an output of the second integrated electronic circuit; and
the signal is fed to the first integrated electronic circuit.

9. The chip of claim 8, comprising a combination circuit configured to generate binary control states received by the first integrated electronic circuit based on the signal output via the output of the second integrated electronic circuit.

10. The chip of claim 8, wherein:
the first integrated electronic circuit is configured to output a second signal via a second output of the first integrated electronic circuit; and
the second signal is fed to the second integrated electronic circuit.

11. The chip of claim 10, comprising a combination circuit configured to generate binary control states received by the second integrated electronic circuit based on the second signal output via the second output of the first integrated electronic circuit.

12. The chip of claim 7, comprising a chain of integrated electronic circuits formed by a plurality of integrated electronic circuits of the one or more integrated electronic circuits, wherein a signal output via an output of a preceding integrated electronic circuit in the chain is fed to a subsequent integrated electronic circuit in the chain.

13. The chip of claim 12, wherein:
the signal output via the output of the preceding integrated electronic circuit comprises at least one of one or more binary control states or one or more binary states; and
the subsequent integrated electronic circuit is configured to combine at least one of the one or more binary control states or the one or more binary states with stored binary output states.

14. The chip of claim 12, wherein a second signal output via a second output of the subsequent integrated electronic circuit in the chain is fed to the preceding integrated electronic circuit in the chain.

15. The chip of claim 14, wherein:
the second signal output via the output of the subsequent integrated electronic circuit comprises at least one of one or more binary control states or one or more binary states; and
the preceding integrated electronic circuit is configured to combine at least one of the one or more binary control states or the binary states with stored binary output states.

16. The chip of claim 12, wherein at least one integrated electronic circuit of the plurality of integrated electronic circuits in the chain is supplied with a second signal output via a second output of the subsequent integrated electronic circuit in the chain and the signal output via the output of the preceding integrated electronic circuit in the chain.

17. The chip of claim 16, wherein:
the signal output via the output of the preceding integrated electronic circuit comprises at least one of one or more first binary control states or one or more first binary states;
the second signal output via the output of the subsequent integrated electronic circuit comprises at least one of one or more second binary control states or one or more second binary states; and
the at least one integrated electronic circuit is configured to combine at least one of the one or more first binary control states, the one or more first binary states, the one or more second binary control states, or the one or more second binary states with stored binary output states.

18. The chip of claim 7, comprising a non-volatile memory configured to:
store a value; and
supply, based on the value, an integrated electronic circuit of the one or more integrated electronic circuits with at least one of one or more binary control states or one or more binary states to be combined with stored binary output states.

19. The chip of claim 18, wherein at least one of:
the non-volatile memory has a locking mechanism such that the non-volatile memory can only be written to once; or
the value is a chip-specific secret value.

20. An integrated electronic circuit, comprising:
a switching network configured to receive binary control states;
a secret-carrying gate representing Boolean secrets and configured to receive binary input states and to output one or more Boolean secrets of the Boolean secrets according to a state sequence of the binary input states;
one or more flip-flops configured to store binary output states output by the switching network, and to supply binary input states to the secret-carrying gate based on the binary output states, wherein the switching network is configured to combine the binary control states and the one or more Boolean secrets output by the secret-carrying gate to generate the binary output states; and
an output configured to output at least one of the one or more Boolean secrets output by the secret-carrying gate or the binary output states output by the switching network to another integrated electronic circuit.

* * * * *